United States Patent
Leonardi

(10) Patent No.: US 6,693,019 B2
(45) Date of Patent: Feb. 17, 2004

(54) METHOD OF MANUFACTURING AN ELECTRONIC POWER DEVICE MONOLITHICALLY INTEGRATED ON A SEMICONDUCTOR AND COMPRISING A FIRST POWER REGION, A SECOND REGION, AND AN ISOLATION STRUCTURE OF LIMITED PLANAR DIMENSION

(75) Inventor: Salvatore Leonardi, Aci S. Antonio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/213,016

(22) Filed: Aug. 5, 2002

(65) Prior Publication Data

US 2003/0060012 A1 Mar. 27, 2003

Related U.S. Application Data

(60) Division of application No. 09/625,079, filed on Jul. 25, 2000, now Pat. No. 6,451,655, which is a continuation-in-part of application No. 09/613,108, filed on Jul. 10, 2000, now Pat. No. 6,495,423.

(30) Foreign Application Priority Data

Aug. 26, 1999 (EP) .............................. 99830531

(51) Int. Cl.$^7$ .............................................. H01L 21/76
(52) U.S. Cl. ...................... 438/444; 438/410
(58) Field of Search .................. 438/444, 405, 438/404, 410, 439, 447

(56) References Cited

U.S. PATENT DOCUMENTS

| | | | |
|---|---|---|---|
| 3,878,551 A | 4/1975 | Callahan, Jr. ................ | 357/48 |
| 4,965,215 A | 10/1990 | Zambrano et al. ............ | 437/31 |
| 5,041,898 A * | 8/1991 | Urabe et al. ................ | 257/758 |
| 5,308,786 A | 5/1994 | Lur et al. .................... | 437/64 |
| 5,374,583 A | 12/1994 | Lur et al. .................... | 437/67 |
| 5,408,124 A | 4/1995 | Palara ........................ | 257/580 |
| 5,650,354 A | 7/1997 | Himi et al. .................. | 437/63 |
| 5,747,377 A * | 5/1998 | Wu ............................ | 438/444 |
| 5,877,050 A | 3/1999 | Gardner et al. ............. | 438/231 |
| 6,033,947 A | 3/2000 | Cacciola et al. ............ | 438/202 |
| 6,040,208 A | 3/2000 | Honeycutt et al. .......... | 438/229 |

FOREIGN PATENT DOCUMENTS

| | | |
|---|---|---|
| EP | 509 183 | 10/1992 |
| EP | 735 580 | 10/1996 |
| JP | 58-161342 | 9/1983 |
| JP | 59-112633 | 6/1984 |
| JP | 61-110446 | 5/1986 |
| JP | 02/068949 | 3/1990 |

\* cited by examiner

*Primary Examiner*—Michael S. Lebentritt
*Assistant Examiner*—Beth E. Owens
(74) *Attorney, Agent, or Firm*—Lisa K. Jorgenson; Robert Iannucci; Seed IP Law Group PLLC

(57) ABSTRACT

An electronic power device is integrated monolithically in a semiconductor substrate. The device has a first power region and a second region, each region including P/N junction formed of a first semiconductor region with a first type of conductivity, which first semiconductor region extends through the substrate from the top surface of the device and is diffused into a second semiconductor region with the opposite conductivity from the first. The device also includes an interface structure between the two regions, of substantial thickness and limited planar size, that includes a trench filled with dielectric material. A method of manufacturing the electronic power device includes forming a silicon oxide-filled trench. The method includes forming, in the substrate, a plurality of small trenches having predetermined widths and -being delimited by a corresponding plurality of semiconductor material walls having second predetermined widths. Next, the semiconductor is oxidized by a thermal process directed to oxidize the walls which produces a single trench.

20 Claims, 5 Drawing Sheets

METHOD OF MANUFACTURING AN ELECTRONIC POWER DEVICE MONOLITHICALLY INTEGRATED ON A SEMICONDUCTOR AND COMPRISING A FIRST POWER REGION, A SECOND REGION, AND AN ISOLATION STRUCTURE OF LIMITED PLANAR DIMENSION

CROSS-REFERENCE TO RELATED APPLICATION

This application is a divisional application of the currently co-pending U.S. patent application Ser. No. 09/625,079, now U.S. Pat. No. 6,451,655 issued Sep. 17, 2002, filed Jul. 25, 2000, which was itself a continuation-in-part of U.S. patent application Ser. No. 09/613,108, now U.S. Pat. No. 6,495,423 issued Dec. 17, 2002, filed Jul. 10, 2000, which claimed the benefit of European Application No. 99830531.2, filed Aug. 26, 1999. This patent application hereby claims priority from and incorporates by reference in its entirety the subject matter of the all of the foregoing referenced applications, as well as any applications which they themselves may reference and claim priority from.

TECHNICAL FIELD

This invention relates to an electronic device monolithically integrated on a semiconductor, having a first power region and at least a second region, as well as an isolation structure of limited planar size.

More specifically, the invention relates to a monolithic semiconductor device, wherein P/N junctions are adapted to sustain high operating voltages; an example of these would be a base-collector junction of an NPN bipolar transistor.

The invention further relates to a method of manufacturing the device with the isolation structure of limited planar size.

The invention relates, particularly but not exclusively, to a structure of limited planar size functioning as an interface structure for a VIPOWER (Vertical Intelligent POWER) type of power structure, and the description to follow will make reference to this field of application for convenience of illustration only.

BACKGROUND OF THE INVENTION

As is known, VIPOWER structures normally comprise a HV power region and an LV drive region, both integrated in the same chip simultaneously, as shown schematically in FIG. 1. In particular, the wells A represent wells intended for accommodating a range of different components which may be of the bipolar or the MOS type. N-doped wells A will be assumed hereinafter by way of example.

The wells A are surrounded by regions B with the opposite conductivity—of the P type in this case—such that they are isolated electrically from one another within the LV drive region and from the HV power region, in a condition of reverse bias of the junctions that they define in combination with the wells A.

It should be noted that the following considerations about isolation would equally apply to integrated structures having first and second power regions.

In VIPOWER structures, the isolation of the devices which form the drive circuitry and are accommodated in the LV region is obtained by the junction isolation technique.

The HV region and LV region are separated by an interface region, referenced C. This interface region C provides electrical and structural isolation between the LV and HV regions.

Similar as other parts of a VIPOWER structure, it comprises two epitaxial layers, referenced EPI1 and EPI2, for forming the buried layers.

The regions referenced B are doped regions with a P-type species, whereas the interface region C is doped with an N-type species. The lateral sequence of the regions B-C-B originates a PNP parasitic component whose electrical effect may harm the adjacent components and should, therefore, be minimized. To attenuate or eliminate the effect of this parasitic component, measures of a structural nature must be taken in forming the interface regions C.

A known method for reducing the effect of the PNP parasitic component is that of placing the regions B at a suitable spacing from each other, thereby to lower the parasitic component gain. This results, however, in increased planar size of the device.

In a condition of high injection (Kirk Effect), the region B contained within the HV region can affect electrically the region B in the LV region. In particular, where a region B forms the base of a power component of the HV region, electric contact may be established with a region B of the P type contained in the LV drive region, resulting in alteration of the electrical characteristics of the device.

Thus, to further reduce the parasitic effects between the two regions, the interface region C should be enhanced with dopant of the N type at least at the surface thereof, so that the gain of the PNP parasitic component can be lowered in that area, and the expansion of the base region of the NPN power component by Kirk Effect be limited. The dopant enhancement of the interface region C is also effective to prevent "punch-through" from occurring between the wells in a condition of high-voltage reverse bias.

However, to avoid premature breakdown fields at the P/N junction formed by the high-voltage region B and the interface region C, the dopant enhanced portion of the region C should be prevented from coming in contact with the P-type dopant of the region B.

To confine the high voltage values to within the bulk region of the device, a field-plate metal layer is formed on top of the interface region C which is isolated from the surface silicon by an oxide region, thereby confining the high voltage to within the bulk area of the device.

In particular, a junction is obtained which has a P side and an N side (enhanced area), both heavily doped. At the photolithographic masking stage, a spacing is to be maintained between the N-enhanced region and the P-type wells to ensure that, after the dopant diffusion, the two heavily doped regions will not be contacting each other.

This arrangement, in combination with the P-type wells of the VIPOWER structures being fairly deep (no shallower than 15 microns), results in the interface region C being quite wide (usually no narrower than 40 microns).

Accordingly, prior approaches to forming interface isolation structures for power devices have resulted in the structures being of a large planar size. Thus, the dimensions of the interface region are the outcome of an extensive compromise, necessary for proper operation of the VIPOWER structures.

SUMMARY OF THE INVENTION

An embodiment of the present invention provides a device intended for working at a high voltage with isolation interface structures having such construction and operation features as to ensure proper performance of the device throughout its operational range, as well as reduced planar size, thereby overcoming the drawbacks with which prior art devices are still beset.

The device is an electronic power device with an isolation interface structure of limited planar size by having trench structures of substantial thickness formed in the silicon substrate and filled up with dielectric material.

The features and advantages of the electronic device according to the invention will become more clearly apparent from the following description of an embodiment thereof, given by way of non-limitative example with reference to the accompanying drawings.

DETAILED DESCRIPTION OF THE INVENTION

Figure 1:
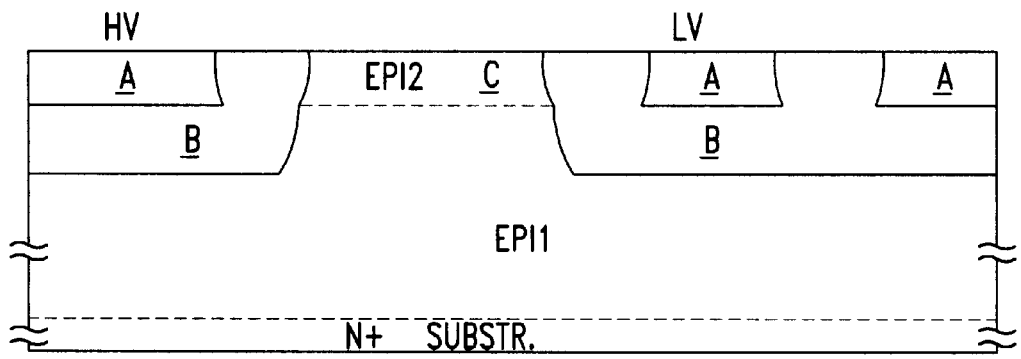
FIG. 1 shows schematically a cross-sectional view through a portion of a VIPOWER device.
Figure 2:
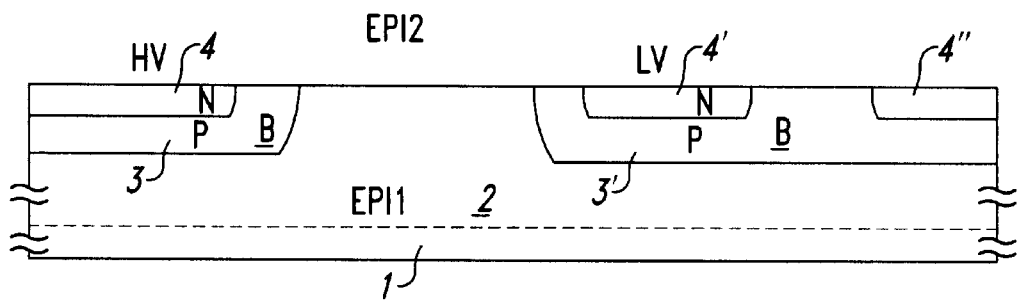
FIGS. 2 to 8 show schematically partial cross-sectional views through two devices of a VIPOWER structure in which an interface structure is connected having a silicon oxide trench of substantial thickness therein to serve an isolation function.

Referring in particular to FIGS. 2 to 8, a method according to the invention for manufacturing—starting from an $N^+$ semiconductor substrate—a monolithically integrated, electronic power device of the VIPOWER type provided with an isolation interface structure of substantial thickness and limited planar size.

Any figures showing cross-sectional views of a VIPOWER device during its fabrication are not drawn to scale, but rather to highlight major features of the invention. The VIPOWER device comprises a HV power region and an LV drive region simultaneously integrated in a common chip.

The process steps and the structures described hereinafter do not reflect a complete process for manufacturing semiconductor power devices. This invention can be practiced along with power device manufacturing techniques currently in use, and only such standard process steps will be discussed as are necessary to an understanding of the invention.

An epitaxial layer 2 of the $N^-$ type is grown over the $N^+$ surface of a substrate 1. First 3 and second 3' P-type regions are diffused into the epitaxial layer 2, with the region 3' being buried relative to the final surface of the device. In one embodiment, the region 3 provides a part of the base region for an NPN power transistor 20 of the HV power circuitry, while the region 3' provides a part of the buried insulator for transistors 22, 24 of the LV drive circuitry.

A first active region 4, a second active region 4', and a third active region 4" of the $N^+$ type, also buried with respect to the final surface of the device, and intended to receive a number of circuitry components, are respectively diffused into the regions 3 and 3'. In one embodiment, the region 4 provides the emitter for the NPN power transistor 20 of the HV region, and the regions 4', 4" provide the buried collector and drain terminals for NPN and VDMOS components 22, 24, respectively, of the LV drive region.

Figure 3:
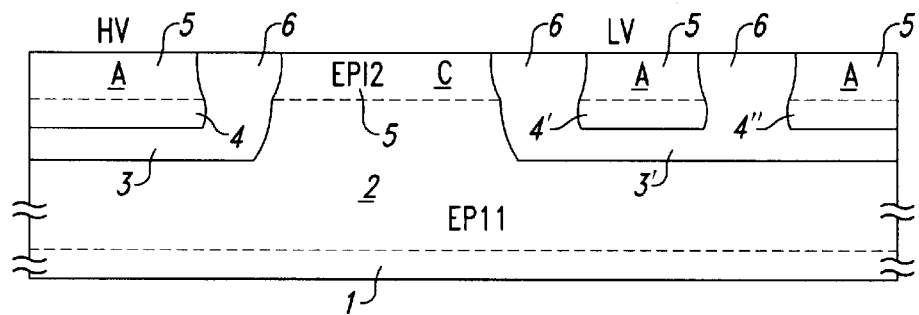

A second epitaxial layer 5 of the $N^-$ type is grown over the surface of the epitaxial layer 2 as shown in FIG. 3. The substrate 1 constitutes, in combination with the epitaxial layer 2 and the epitaxial layer 5, the bulk region of the transistors.

A set of regions 6, 6', 6" of the $P^+$ type are formed by diffusion into the epitaxial layer 5 as shown in FIG. 3. The region 6, together with the region 3, forms the base for the NPN power transistor 20 and the regions 6', together with the region 3', forms the base region of the transistor 22 of the LV drive region.

Figure 4:
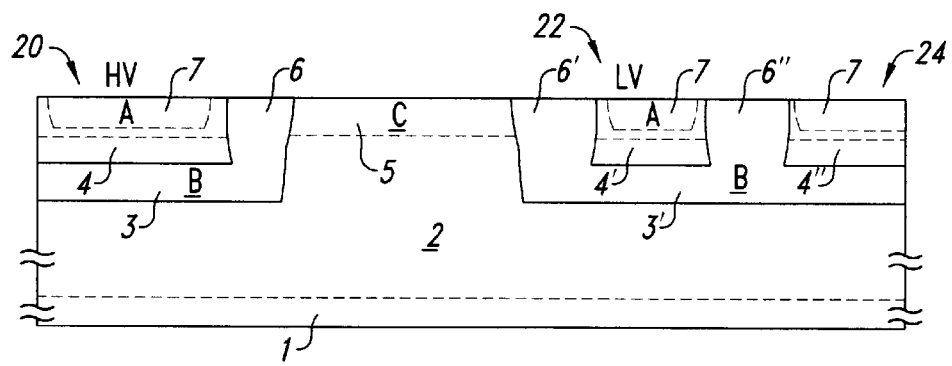
Figure 5:
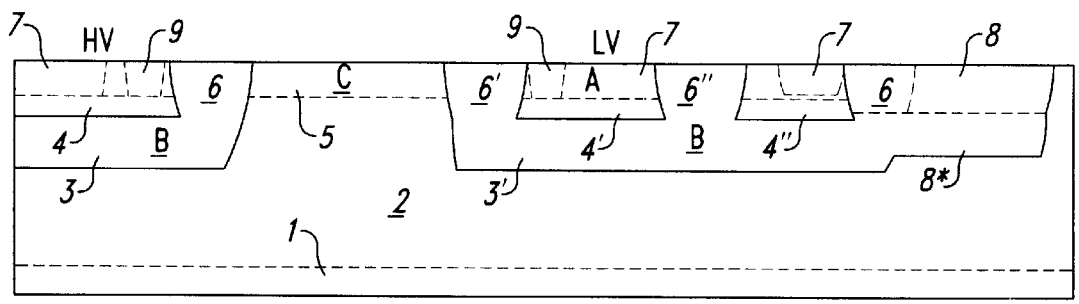

The epitaxial layer 5 provides for the formation of isolated N wells, referenced 7, which are fully bounded by means of a further implantation and diffusion of the P type into the layer 5, as shown schematically in FIGS. 4 and 5.

Regions of P and the N type can be formed inside the wells 7, e.g., by means of N-well or P-well enhanced regions, using dedicated implantations and diffusions, to be carried out directly after growing the epitaxial layer 5 and before forming the regions 6, 6', 6". In actual practice, this step of forming the P and N type regions can be deferred to the completion of the VIPOWER structures, once the active areas of the components are defined.

It should be noted that the N-well regions 7 can be formed inside the HV region, the LV region, and the interface region C. Within the latter, the N-well layer is effective to lower the gain of the PNP parasitic component formed by the P-type wells in the HV and LV regions, respectively, and by the interface region C that may become triggered in some specific bias conditions.

Edge structures should be provided around the isolation region 6 in high-voltage devices. In this case, directly after implanting this isolation region 6, a further implantation of P-type dopant at a low dosage is carried out as shown schematically in FIG. 5. This P-type dopant can actually be diffused together with the insulator, and defines an edge region 8.

To improve the edge efficiency of HV and UHV structures, a buried ring 8* can be provided contiguous with the buried region 3', by implanting and diffusing in a dedicated manner the P-type dopant, subsequently to defining the first epitaxial region 2 and prior to defining the second epitaxial region 5.

For satisfactory performance of the whole edge structure, in one embodiment the edge region 8 and the ring 8*, both of the P type, are linked together to ensure electrical continuity of the dopant.

After defining the isolation and edge structure, an implantation of the N type is carried out, or alternatively, a sinker deposition process is carried out and followed by diffusion into the N-type wells 7, such that regions 9 are formed in contact with the buried regions 4 and 4'.

Upon completion of these steps, the active areas of the components to be formed inside the isolation wells are defined. The processing of VIPOWER integrated structures is terminated with the definition of the contact areas and the metallization thereof.

A thin oxide layer OL, e.g., a few hundred Ångstroms thick, is formed over the surface of the epitaxial layer 5. A dielectric layer DL, such as silicon nitride, is deposited on the oxide layer OL to a thickness of approximately 1000 Ångstroms, for example.

Advantageously, an isolation structure of substantial thickness is provided, in the interface region C, which has a silicon oxide trench of suitable size to prevent current from flowing through the device and, therefore, the triggering of parasitic components.

The isolation structure in the interface region C is obtained by means of one or more trenches, to be formed by an etching step through the silicon layers, followed by an oxidizing step to produce a single dielectric region.

The process sequence described hereinabove in relation to FIGS. 2 to 5 is thus modified by the addition of the steps of forming the trenches, followed by an oxidation step.

Figure 6:
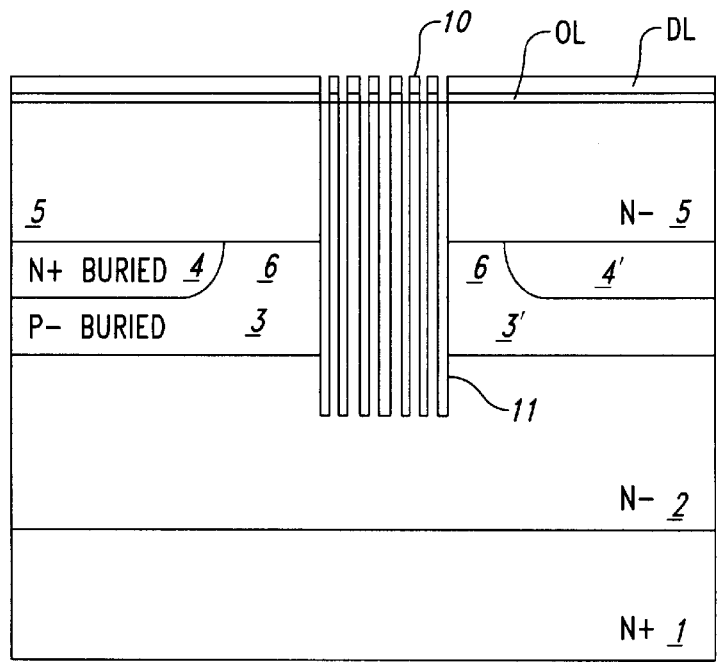

A particular advantage is that a plurality of small equispaced trenches 10 are formed in the layers 5 and 2, within the region C where said isolation structure is to be provided, using conventional photolithographic techniques and successive etching steps through the layers 6 and 3, the epitaxial layer 5, and a portion of the epitaxial layer 2, as shown in FIG. 6.

Advantageously, the small equispaced trenches 10 lie parallel to one another. The regions of the small equispaced trenches 10 delimit a plurality of walls 11 which are made of the semiconductor material and extend parallel to the small equispaced trenches 10, and exhibit a substantially comb-like profile when viewed in a vertical cross-section through at least two of the walls 11.

Thereafter, the semiconductor is subjected to a thermal treatment under an oxidizing medium. The oxidizing thermal treatment transforms all of the silicon walls which are delimiting the trenches into oxide. Advantageously in this embodiment of the invention, the same thermal cycle can be used as for diffusing the isolation regions 6.

Alternatively, the trenches 10 could be formed directly after defining the regions 5 and before diffusing the regions 9. In this case, as the thermal cycle for oxidizing the trenches 10, the same thermal cycle can be used as in forming the field oxide, which cycle is also utilized for diffusing the sinker regions 9.

Advantageously in this embodiment of the invention, the same thermal cycles as are provided by the standard process steps for manufacturing VIPOWER structures can be used in the step of oxidizing the trenches 10, there being no need of dedicated processes with their added cost.

Figure 7:
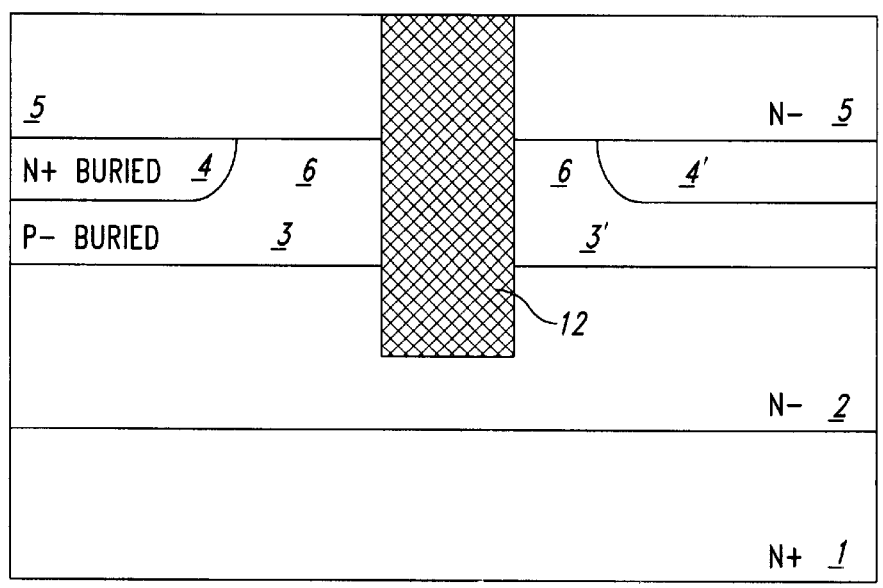

By suitably dimensioning the small equispaced trenches 10, a single trench 12 can be obtained which is filled up with oxide as shown in FIG. 7.

In particular, the ratio of a predetermined width of the trenches 10 to a predetermined width of the walls 11 is chosen such that the trenches exit the oxidizing thermal process completely filled with oxide and in the form of the single trench 12.

Alternatively, where the oxidizing process produces no trenches completely filled with oxide, a dielectric or a polysilicon layer with planarizing capabilities may be deposited to fill the vacant trench regions.

A planarizing anisotropic etching step, or etch-back, is then carried out which may be followed by planarizing such as by a chemical-mechanical planarizing process.

In this method, the top surfaces of the oxide-filled trenches 12 and the surface of the layer 5 will be coplanar, thereby enabling the power device forming process to be continued conventionally.

Figure 8:
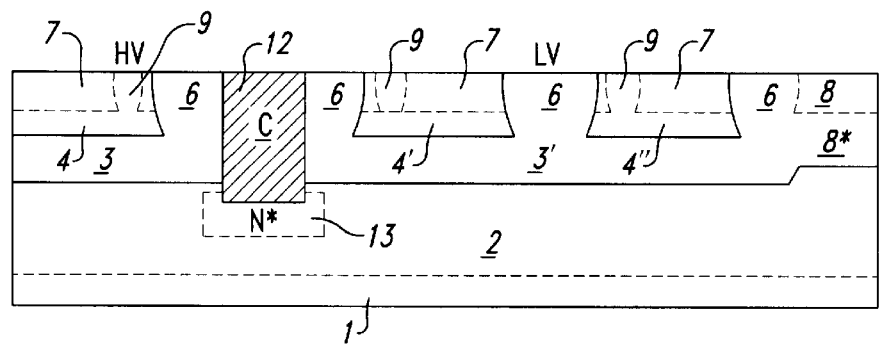

Advantageously, before the oxidation step, the interior of the trench 12 may be doped by means of a channeling implantation of the N type, so as to dope the deep portion of the trench 12 and obtain an N region, referenced 13 and shown schematically in FIG. 8. This region 13 is effective to suppress any deep parasitic PNP components, such as might be triggered between the P-type wells of the HV and LV regions.

It should be noted that deep dielectric regions, especially deeper ones than the P wells, are more effective in that they eliminate the bulk injection contribution from said parasitic PNP transistor.

From the process sequence described hereinabove, and the resultant interface, as shown in FIG. 8, several modified structures can be derived, as described herein below.

Figure 9:
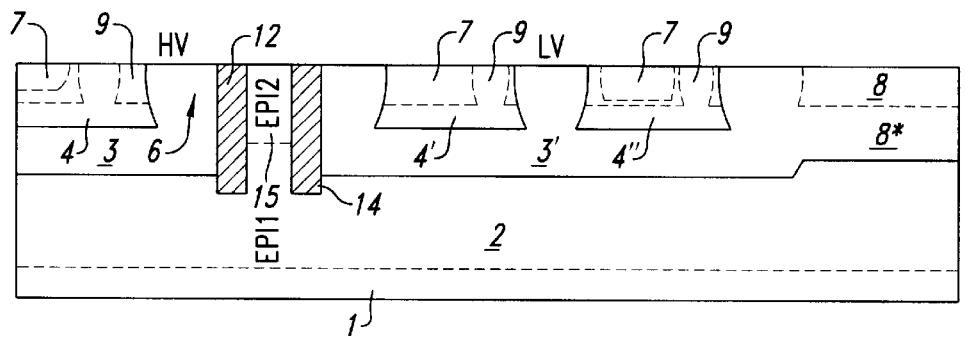
FIGS. 9 to 11 illustrate in schematic form modified embodiments of the VIPOWER structure according to the invention.

Shown in FIG. 9 is a VIPOWER structure which includes an additional trench 14, separate from the trench 12 and formed at the sides of its respective P-type wells 3 and 3', which wells are separated from each other by an intervening region 15 of the P type.

In this case, the modified process from the previously described embodiment would comprise forming two separate pluralities of small trenches instead of one.

This solution requires more space than VIPOWER structures having a single trench 12. However, it ensures isolation from an electrical standpoint, and allows, if required, the formation of dedicated structures (passive electric components adapted to sustain high operating voltages, e.g., high-voltage resistors) within an intervening P region (region 15) protected by dielectric.

In this case, this intermediate region 15 can be enhanced with dopant of the N type.

Figure 10:
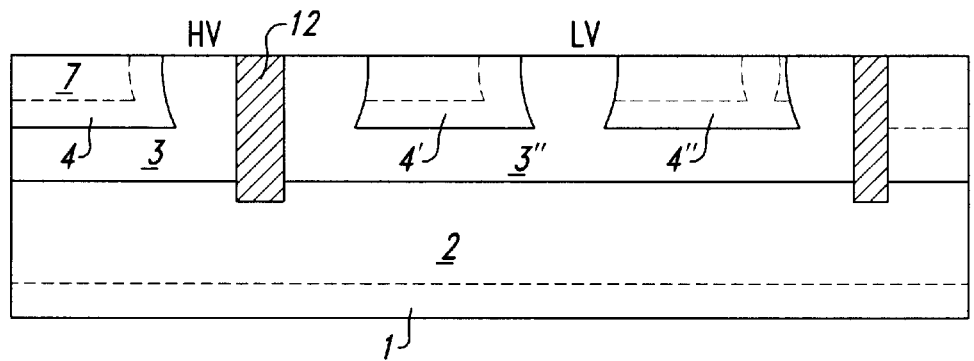

In addition, by providing a dielectric trench 12 to bound the edge of the LV region, as shown in FIG. 10, the N-well enhancement (layer 7) can be omitted which is applied to conventional devices in order to prevent reaching-through. In particular, enhancing the well regions can be omitted by using a dopant level in the second epitaxial region 5 which equals the peak concentration in the N-well layer.

In this case, the properties of the dielectric trench 12 used as the edge region would ensure the device capacity for high voltage.

Figure 11:
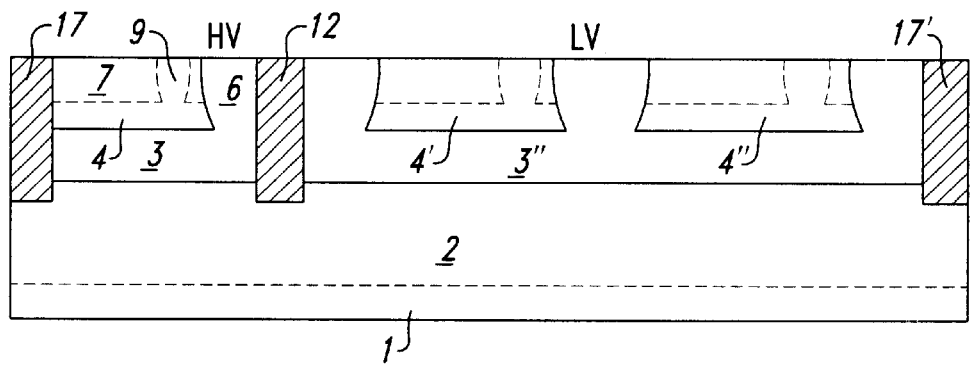

A further embodiment of the VIPOWER structure according to the invention is shown in FIG. 11 wherein a single region of the P-buried type, referenced 3", is provided for both the HV power region and the LV drive region.

It should be noted that the process sequence for implementing this embodiment of the invention is modified in that the interface region C no longer requires to be masked from the P-type implanting step.

In the extreme, it could be thought of eliminating the P-buried mask altogether, by providing the region 3" with an implantation affecting the whole wafer that contains the device. The VIPOWER structure would be limited by dielectric regions 17, 17', the collector contact for the HV power component being provided on the back side of the chip.

In summary, the isolation structures according to this invention allow interface structures to be obtained which are isolated dielectrically and require less integration area than interface structures of the prior art.

The modified embodiments described allow, alternatively, the masking and implanting steps for the isolation and the sinker regions, and the step of masking the N-well regions, to be omitted by using a buried epitaxial layer which is more heavily doped.

The interface structures of this invention are useful in any devices provided with several power regions, or one power region flanked by signal regions, being separated by intermediate silicon regions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of manufacturing an electronic power device being monolithically integrated in a semiconductor substrate, the method comprising:

forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and providing a silicon oxide-filled trench by:

forming, in the substrate, a first plurality of small trenches having first predetermined widths and being delimited by a corresponding first plurality of semiconductor material walls having second predetermined widths; and oxidizing the semiconductor substrate by a thermal process directed to oxidize said first plurality of walls and produce a first single trench.

2. A method of manufacturing an electronic device according to claim 1, further comprising ion implanting, using an N-type dopant, into the first plurality of small trenches thereby to obtain a heavily-doped region beneath said first plurality of small trenches.

3. A method of manufacturing an electronic device according to claim 2, wherein said ion implanting step using N-type dopant into the region beneath the first plurality of small trenches is carried out before growing said first semiconductor region and the N-type dopant is diffused concurrently with a buried region of the device.

4. A method of manufacturing an electronic device according to claim 1, wherein said thermal process directed to oxidize the walls and obtain the first single trench is carried out using thermal cycles that are simultaneously used to form a doped region in the first semiconductor region.

5. A method of manufacturing an electronic device according to claim 1, wherein a ratio of said first predetermined width to said second predetermined width is chosen such that the first plurality of small trenches exit the oxidizing thermal process completely filled with oxide and in the form of said first single trench.

6. A method of manufacturing an electronic device according to claim 1, further comprising depositing a dielectric layer with planarizing properties for filling the regions of the first plurality of small trenches.

7. A method of manufacturing an electronic device according to claim 1, wherein the formation of said first plurality of small trenches breaks the continuity of said second semiconductor region.

8. A method of manufacturing an electronic device according to claim 1, wherein the formation of said first plurality of small trenches is carried out in such a way that said first plurality of small trenches extend into said second semiconductor region.

9. A method of manufacturing an electronic device according to claim 1, further comprising:

forming, in the substrate, a second plurality of small trenches having predetermined widths and being delimited by a corresponding second plurality of semiconductor material walls having second predetermined widths; and oxidizing the semiconductor substrate by a thermal process directed to oxidize said second plurality of walls and produce a second single trench.

10. A method of manufacturing an electronic device according to claim 1, further comprising filling the first single trench by using the steps of:

growing a thin thermal oxide layer;

depositing an oxide layer in order to completely fill the first single trench.

11. A method of manufacturing an electronic device according to claim 2, wherein the growing of the thin thermal oxide layer provides for a layer having a width between 500 and 1000 Angstroms.

12. A method of manufacturing an electronic power device monolithically integrated in a semiconductor substrate, the method comprising:

forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and providing a silicon oxide-filled trench by:

forming, in the substrate, a plurality of small trenches having predetermined widths and being delimited by a corresponding plurality of semiconductor material walls having second predetermined widths; and oxidizing the semiconductor substrate by a thermal process directed to oxidize said walls and produce a single trench; and ion implanting, using an N-type dopant, into the plurality of small trenches thereby to obtain a heavily-doped region beneath said plurality of small trenches.

13. A method of manufacturing an electronic device according to claim 12, wherein said ion implanting step using the N-type dopant into the region beneath the plurality of small trenches is carried out before growing said first semiconductor region and the N-type dopant is diffused concurrently with a buried region of the device.

14. A method of manufacturing an electronic power device monolithically integrated in a semiconductor substrate, the method comprising:

forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and providing a silicon oxide-filled trench by:

forming, in the substrate, a plurality of small trenches having predetermined widths and being delimited by a corresponding plurality of semiconductor material walls having second predetermined widths; and oxidizing the semiconductor substrate by a thermal process directed to oxidize said walls and produce a single trench, wherein said thermal process directed to oxidize the walls and obtain the single trench is carried out using thermal cycles that are simultaneously used to form a doped region in the first semiconductor region.

15. A method of manufacturing an electronic power device monolithically integrated in a semiconductor substrate, the method comprising:

forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and providing a silicon oxide-filled trench by:
  forming, in the substrate, a plurality of small trenches having predetermined widths and being delimited by a corresponding plurality of semiconductor material walls having second predetermined widths; and
  oxidizing the semiconductor substrate by a thermal process directed to oxidize said walls and produce a single trench; and
depositing a dielectric layer with planarizing properties for filling the regions of the plurality of small trenches.

16. A method of manufacturing an electronic power device monolithically integrated in a semiconductor substrate, the method comprising:
  forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and
  providing a silicon oxide-filled trench by:
    forming, in the substrate, a plurality of small trenches having predetermined widths and being delimited by a corresponding plurality of semiconductor material walls having second predetermined widths; and
    oxidizing the semiconductor substrate by a thermal process directed to oxidize said walls and produce a single trench, wherein the formation of said plurality of small trenches breaks the continuity of said second semiconductor region.

17. A method of manufacturing an electronic power device monolithically integrated in a semiconductor substrate, the method comprising:
  forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and
  providing a silicon oxide-filled trench by:
    forming, in the substrate, a plurality of small trenches having predetermined widths and being delimited by a corresponding plurality of semiconductor material walls having second predetermined widths; and
    oxidizing the semiconductor substrate by a thermal process directed to oxidize said walls and produce a single trench, wherein the formation of said plurality of small trenches is carried out in such a way that said plurality of small trenches extend into said second semiconductor region.

18. A method of manufacturing an electronic power device monolithically integrated in a semiconductor substrate, the method comprising:
  forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and
  providing a first silicon oxide-filled trench by:
    forming, in the substrate, a first plurality of small trenches having first predetermined widths and being delimited by a corresponding first plurality of semiconductor material walls having second predetermined widths; and
    oxidizing the semiconductor substrate by a first thermal process directed to oxidize said first plurality of semiconductor material walls and produce a first single trench;
  forming in the substrate, a second plurality of small trenches having the first predetermined widths and being delimited by a corresponding second plurality of semiconductor material walls having second predetermined widths; and
  oxidizing the semiconductor substrate by a second thermal process directed to oxidize said second plurality of semiconductor material walls and produce a second single trench.

19. A method of manufacturing an electronic power device monolithically integrated in a semiconductor substrate, the method comprising:
  forming in the substrate a power, first active region and a second active region, each said active region including a P/N junction formed of a first semiconductor region with a first type of conductivity, extending through the substrate from the top surface of the device and being diffused into a second semiconductor region with the opposite conductivity from the first semiconductor region; and
  providing a silicon oxide-filled trench by:
    forming, in the substrate, a plurality of small trenches having predetermined widths and being delimited by a corresponding plurality of semiconductor material walls having second predetermined widths; and
    oxidizing the semiconductor substrate by a thermal process directed to oxidize said walls and produce a single trench; and
  filling the single trench by using the steps of:
    growing a thin thermal oxide layer;
    depositing an oxide layer in order to completely fill the single trench.

20. A method of manufacturing an electronic device according to claim 19, wherein the growing of the thin thermal oxide layer provides for a layer having a width between 500 and 1000 Angstroms.

* * * * *

UNITED STATES PATENT AND TRADEMARK OFFICE
CERTIFICATE OF CORRECTION

PATENT NO. : 6,693,019 B2
DATED : February 17, 2004
INVENTOR(S) : Salvatore Leonardi It is certified that error appears in the above-identified patent and that said Letters Patent is hereby corrected as shown below:

Column 7,
Lines 30 and 31, "using N-type dopant" should read as -- using the N-type dopant --.

Column 8,
Line 8, "according to claim 2," should read as -- according to claim 10, --.

Signed and Sealed this

First Day of June, 2004

JON W. DUDAS
*Acting Director of the United States Patent and Trademark Office*